United States Patent
Abramovich et al.

(10) Patent No.: US 6,939,408 B1
(45) Date of Patent: Sep. 6, 2005

(54) METHOD FOR SURFACE PREPARATION OF WORKPIECES UTILIZING FLUID SEPARATION TECHNIQUES

(75) Inventors: Francis A. Abramovich, Milton, VT (US); Nicole S. Carpenter, Burlington, VT (US); Joseph R. Drennan, Winooski, VT (US); Rick H. Gaylord, Essex Junction, VT (US); Casey J. Grant, Hinesburg, VT (US); Kenneth F. McAvey, Jr., Winooski, VT (US); Mark A. Pakulski, Colchester, VT (US); Joel M. Sharrow, South Hero, VT (US); William A. Syverson, Colchester, VT (US); Alison K. Easton, South Burlington, VT (US); Kenneth H. Yao, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 09/650,103

(22) Filed: Aug. 29, 2000

(51) Int. Cl.$^7$ .................................................. B08B 3/00
(52) U.S. Cl. ....................... 134/2; 134/25.4; 134/25.5; 134/32; 134/902
(58) Field of Search ............................... 134/2, 3, 25.4, 134/25.5, 32, 902

(56) References Cited

U.S. PATENT DOCUMENTS

| 3,888,693 A |   | 6/1975  | Schevey et al. |
|---|---|---|---|
| 4,619,706 A |   | 10/1986 | Squires et al. |
| 5,603,849 A |   | 2/1997  | Li |
| 5,911,837 A | * | 6/1999  | Matthews ....................... 134/2 |
| 5,989,359 A | * | 11/1999 | Berbel ........................... 134/10 |

* cited by examiner

Primary Examiner—Zeinab El-Arini
(74) Attorney, Agent, or Firm—DeLio & Peterson, LLC; John J. Tomaszewski; William D. Sabo

(57) ABSTRACT

A method for preparing a workpiece surface utilizing two more fluids of differing density and miscibility which create one or more fluid interfaces wherein the fluids are chosen such that the solubility or affinity of one of the fluids is high for a material to be removed from the workpiece surface while the other fluid has a low solubility or affinity for the material to be removed. The workpiece surface is treated by passing the workpiece through the fluid interface. The two or more fluids are preferably dispensed into an apparatus and allowed to settle into two or more predominant layers separated by an interface. Surface preparation techniques which may benefit from the present invention include etching, cleaning or drying processes and the like.

4 Claims, 3 Drawing Sheets

METHOD FOR SURFACE PREPARATION OF WORKPIECES UTILIZING FLUID SEPARATION TECHNIQUES

BACKGROUND OF THE INVENTION

1. Field of the Invention

This invention discloses a method and apparatus for utilizing fluid separation techniques for preparing a workpiece surface. Multiple fluids of differing densities and miscibilities wherein a fluid interface is present may be used to remove foreign materials on a workpiece surface.

2. Description of Related Art

During industrial workpiece fabrication, e.g., semiconductor wafer processing, wet chemical processing takes place during various standard processing steps. It is during these wet chemical processing steps that harsh chemicals (i.e. HF, $H_2SO_4$, $H_3PO_4$, $HNO_3$, $NH_4OH$, etc.) are used to perform various processes on the wafers such as film removal, cleaning, and/or surface conditioning. It is important for environmental and health reasons that these hazardous chemicals be removed prior to subsequent processing of the wafer. It is a common, industry recognized technique to use water as a final rinse to remove the hazardous chemicals from the wafer surface. The final step in any standard processing is to thoroughly remove all residual chemicals, including water, from the wafer surface.

Current workpiece surface preparation processes include tank processes and processes utilizing various techniques, such as megasonics, sprays, chemicals, spin, puddle, brush, etc. These techniques have been optimized singularly and in various combinations for different surface preparation applications. However, further optimization is required in order to achieve ideal particle, foreign material, etc., removal. Workpiece surface characteristics topography, prior process effects, etc., impact subsequent process effectiveness. Alternate techniques which can be used singularly or in combination with current techniques are needed that improve cleaning, surface preparation, coating and chemical removal performance. Also, there is a need for the development of more environmentally friendly processes which do not require disposal of chemicals.

It is also well known that at various stages of IC processing, the surface of the wafer is changed so as to increase or decrease the amount of exposed silicon. In the case of increasing exposed silicon, for example, as in DRAM devices utilizing deep trenches, de-ionized water (DIW) will dissolve small amounts of silicon. If the DIW is allowed to evaporate, the dissolved silica is re-deposited onto the wafer either on the surface or within structures such as deep trenches. Such silicate deposits are called watermarks. Watermarks that remain on a wafer during subsequent processing can result in defects within the ICs. Prevention of watermark formation is key to limiting defects. One method of reducing or eliminating watermark formation is to prevent the DIW from evaporating while remaining in contact with the wafer surface. To achieve this goal, it is necessary to remove the water from the surface before the wafer is exposed to the atmosphere.

Bearing in mind the problems and deficiencies of the prior art, it is therefore an object of the present invention to provide a method of performing various processes on a wafer or workpiece surface.

It is another object of the present invention to provide a method of preparing a workpiece surface which removes substantially all foreign materials and residual chemicals, including water, from the workpiece surface.

A further object of the invention is to provide a method of removing water from a workpiece surface before the workpiece is exposed to the atmosphere such that water marks are substantially eliminated from the workpiece surface.

It is yet another object of the present invention to provide an apparatus for practicing the above methods.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of preparing one or any number of article surfaces comprising the steps of: providing at least two fluids of differing densities such that a fluid interface exists between each fluid layer; providing one or any number of articles with a reactive component on a surface of the article having a greater affinity or solubility to one of the at least two fluids; positioning the one or any number of articles into the at least two fluids; and treating the reactive component on the article surface by drawing the article through at least one fluid interface vertically, horizontally, or at any other orientation. Preferably, the step of providing at least two fluids of differing densities includes providing liquids, pressurized gases or mixtures thereof.

Preferably, the method of this aspect further includes the step of terminating the treating step by extracting the article through the fluid interface into another of the at least two fluids having substantially less affinity or solubility to the reactive component or removing one of the at least two fluids having substantially less affinity or solubility to the reactive component.

Alternatively, the step of providing an article with a reactive component, the reactive component has a greater affinity or solubility to a fluid having a higher density than another of the at least two fluids, such that the step of positioning the article into the at least two fluids comprises positioning the article into the at least two fluids with agitation and further including the step of ceasing the agitation and drawing the article through the fluid interface. Alternatively, the step of providing an article with a reactive component, the reactive component has a greater affinity or solubility to a fluid having a higher density than another of the at least two fluids, and wherein the step of positioning the article into the at least two fluids comprises positioning the article into the at least two fluids with mixing at an elevated temperature and further including the steps of ceasing the mixing at an elevated temperature and cooling the fluids such that the fluid having a higher density with a greater affinity or solubility for the reactive component settles and drawing the article through the fluid interface.

In a second aspect, the present invention is directed to a method of preparing a workpiece surface comprising the steps of: providing a reaction vessel having a first inlet/outlet means located at a bottom of the vessel and a second inlet/outlet means located above the first outlet means; providing a first fluid into the reaction vessel; providing at least one other fluid into the reaction vessel, the at least one other fluid having a higher density than the first fluid such that a fluid interface exists between a first fluid layer and an at least one other fluid layer; providing a workpiece having a surface component having a greater affinity or solubility to either the first fluid or the at least one other fluid; submerging the workpiece into the reaction vessel having the first fluid and the at least one other fluid such that the workpiece is below the fluid interface; treating the surface component by drawing the workpiece through the fluid interface; and terminating the treating step. This aspect may further include the step of providing another fluid into the reaction vessel having a different density than either the first fluid or the at least one other fluid. The another fluid may comprise a pressurized gas.

Wherein the step of providing a workpiece having a surface component comprises providing a workpiece having a surface component having a greater affinity or solubility to the first fluid and the step of submerging the workpiece into the reaction vessel comprises positioning the workpiece in the at least one other fluid layer such that during the step of treating the surface component, the surface component remains in the first fluid layer. Wherein the step of providing a workpiece having a surface component comprises providing a workpiece having a surface component having a greater affinity or solubility to the at least one other fluid and the step of submerging the workpiece into the reaction vessel comprises passing the workpiece through the fluid interface into the at least one other fluid layer such that the surface component is treated with the at least one other fluid layer.

The current aspect may further include the step of heating the first fluid and the at least one other fluid into solution after submerging the workpiece into the reaction vessel such that upon cooling, the first fluid and the at least one other fluid layer are immiscible with the fluid interface present and the surface component is substantially present in only one of the fluid layers. Alternatively, the current aspect may further include the step of agitating the first fluid and the at least one other fluid after submerging the workpiece into the reaction vessel such that upon ceasing agitation, the first fluid layer and the at least one other fluid layer are immiscible with the fluid interface present and the surface component is substantially present in only one of the fluid layers.

In a third aspect, the present invention is directed to a method of removing water and water soluble impurities from a workpiece surface comprising the steps of: providing a reaction vessel containing water; providing at least one fluid having a different density than the water such that predominant fluid layers and a water layer exists with a fluid interface between each fluid layer and the water layer; passing the workpiece through the at least one fluid interface; and stripping the water and water soluble impurities from the workpiece surface as the water and water insoluble impurities remain in the water layer. This aspect may further include the step of removing the water layer from the reaction vessel when the step of stripping the water and water soluble impurities is substantially completed if the workpiece is positioned below the water layer. Additional energy input such as thermal energy, agitation or sonic energy may enhance the removal rate of the impurities.

In a fourth aspect, the present invention is directed to a method of removing a surface component from a workpiece surface comprising the steps of: providing an etchant fluid; providing at least one fluid immiscible with the etchant fluid having a different density than the etchant fluid; positioning the workpiece in the etchant solution to facilitate etching of the surface component; and terminating etching of the surface component when the workpiece is passed through the fluid interface into the at least one fluid immiscible with the etchant fluid.

Wherein the step of providing at least one fluid immiscible with the etchant solution comprises providing two fluids immiscible with the etchant solution, both fluids having a lower density than the etchant solution and immiscible with each other such that a first fluid interface exists between the two fluids and the etchant solution and a second fluid interface exists between the two fluids.

In a fifth aspect, the present invention is directed to an apparatus for preparing a workpiece surface utilizing multiple fluids comprising: an open vessel; one or more interior partitions extending between interior walls of the vessel within a top portion of the vessel without extending to a bottom surface of the vessel creating at least two chambers such that multiple liquid interfaces are created when the vessel is filled with a high density fluid above a bottom surface of the partition and one or more fluids of lower density are poured into each of the chambers.

The apparatus may further include one or more interior partitions extending from a bottom portion of the vessel alternating with the one or more interior partitions extending between the interior walls of the vessel such that the vessel may be filled with more than one high density fluid above a bottom surface of the partition yet below a top portion of the partition extending from a bottom portion of the vessel.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
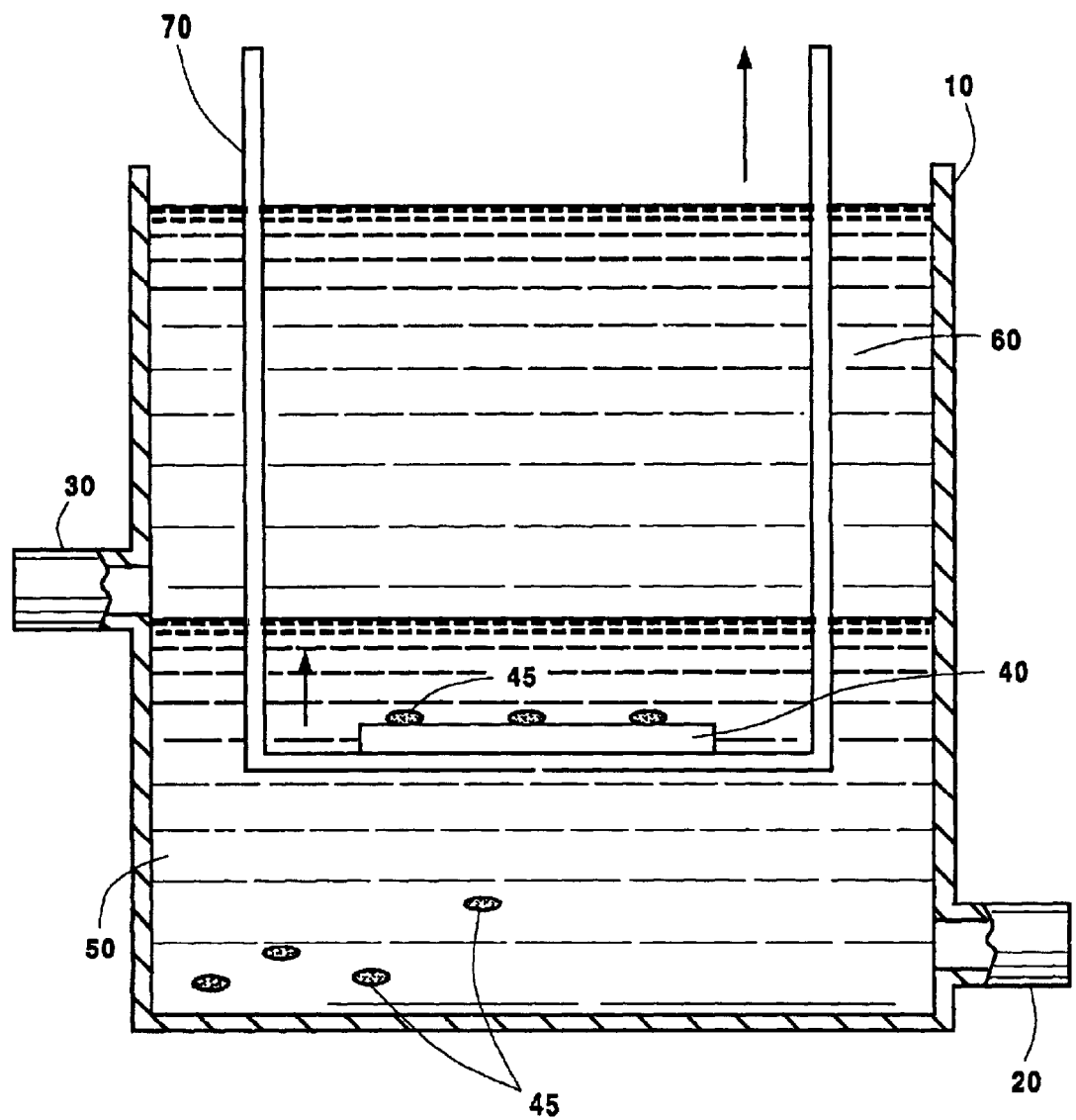
FIG. 1 is a cross-sectional view of a preferred apparatus of the present invention used in practicing a preferred embodiment of the present invention.

In describing the preferred embodiment of the present invention, reference will be made herein to FIGS. 1–3 of the drawings in which like numerals refer to like features of the invention. Features of the invention are not necessarily shown to scale in the drawings.

This invention teaches the use of two or more fluids of low miscibility and of differing densities as a workpiece surface preparation system. The properties of low miscibility and differing density are advantageous in the implementation of this idea. In addition to the above mentioned properties, the fluids should be chosen so that the solubility or affinity of one of the fluids is high for the material to be removed from a surface, while the other fluid has low solubility or affinity for the material to be removed. Fluids are defined as any material or substance that changes shape or direction uniformly in response to an external force imposed on it, and include not only liquids but gases as well. See *Hawley's Condensed Chemical Dictionary*, 13$^{th}$ Edition (1997).

Preferably, this technique is practiced in an open tank or a contained vessel depending upon the chemicals involved although any process enclosure would suffice. At least two fluids having the qualities described above are dispensed into the tank and allowed to settle resulting in two or more predominant layers separated by a minimal interface or two or more predominant layers separated by a diffuse interface. The surface preparation technique, e.g., cleaning or drying process, may occur within one or more of the predominant layers, at the interface or both.

A final surface preparation step may be to pass the workpiece or wafer through the interface(s) vertically, horizontally, or at any other orientation. The rate of extraction should be controlled to prevent excessive stirring of the two or more fluids. Preferably, the interface should remain fairly flat during the extraction process to take advantage of the differing solubility characteristics of the fluids being utilized. In addition, the rate of extraction can be adjusted to take advantage of any surface tension gradient that exists between the two fluids to sweep the workpiece free of the higher density fluid and/or other contaminants. It is not required that the workpiece be dried via the pumping action of the surface tension gradient although this may be an incidental result. Agitation or energy input which is periodic in time, or any combination thereof may be imparted on the two or more fluids followed by fluid settling allows the solutions to separate and could be included as part of the process prior to passing the workpiece through the interface(s). Additionally, mixing the fluids at an elevated temperature for a portion of the process followed by a temperature reduction to cause separation of the fluids could be included as part of this process prior to passing the workpiece or wafer through the fluid interface.

In a first embodiment for carrying out a cleaning process, at least two fluids are chosen wherein a higher density fluid(s) (HDL) is preferably chosen to have a high solubility or affinity for the material to be removed. A lower density fluid(s) (LDL) floats on top of the HDL. Preferably, the LDL should have low solubility for the material to be removed although this embodiment may be practiced with an LDL that has a higher solubility or affinity for the material to be removed. The object to be cleaned is introduced into the HDL. This can be done before or after the introduction of the LDL. After soaking for a time commensurate with the reaction rate of the fluid with the material being removed from the object, the object can then be extracted by lifting the object up through the interface between the two fluids vertically, horizontally, or at any other orientation. The rate of the extraction should be controlled to prevent excessive stirring of the two fluids; preferably, the interface should remain fairly flat during the extraction process. In addition, the rate of extraction can be adjusted to take advantage of any surface tension gradient that exists between the two fluids to result in the object being swept free of the higher density fluid. It is not required that the object be dried via the pumping action of the surface tension gradient although this may be an incidental result.

An exemplary application of this type of cleaning system is: oil floating on water. The water would have high solubility for, for example, halogen compounds such as HCl, while the oil would be chosen to have low solubility for the same material. The workpiece can be cleaned in the water and coated with the oil for corrosion protection.

Another preferred embodiment of this invention teaches the method of removing water from the wafer surface prior to its exposure to the atmosphere. In this embodiment for drying or water extraction utilizing solubility and miscibility properties, a water insoluble fluid (WIF) having a different density than water is provided in an immersion tank. Wet workpieces are then inserted and soaked in the water insoluble solution. If the surface energy of the water-workpiece interface is greater than that of the water-WIF interface, then water remaining on the workpiece will be released from the workpiece preferably forming globules which will migrate away from the workpiece due to the buoyancy force of the water globule in the WIF. This method essentially strips the water and the water soluble impurities from the workpiece surface. Additional energy input, such as agitation or an energy input which is periodic in time, or any combination thereof, can enhance the removal rate.

Alternatively, in systems for drying or water extraction utilizing solubility and miscibility properties, a multi-medium system comprising a fluid with high solubility for water and at least one fluid with low solubility for water, the fluids being of differing densities and of low relative miscibility, are provided in an immersion tank. Workpieces are then inserted into the water soluble layer of the system where final rinsing can occur if desired. The wafer or workpiece is then passed through the fluid interface as described in the previous embodiment. Residual water and water soluble impurities are left behind in the fluid with high solubility for water as the wafer or workpiece is passed through the system interface.

Examples of systems which remove water and water soluble impurities comprise a fluid with a density lower than that of water would be an ether/water system. In this system, the water and water soluble impurities from the workpieces would remain in the bottom of the tank. Workpieces could then be pulled directly up and out of the top of the tank. Another example of a system containing a solvent with a density lower than that of water comprises a liquid butane/water system at room temperature. This system would require a pressurized vessel or chamber to form and/or maintain the butane in its liquid state.

An example of a system containing a solvent with a density higher than that of water would be a chloroform/water system. In this system, water and water soluble impurities from the workpieces would remain in the top layer of the system as the wafers are being passed through the fluid interface. This system may require a method of removing the wafers without exposing the wafers to the water portion of the system immediately prior to removal. This may be achieved by providing a system apparatus capable of removing water above the fluid interface prior to removing the workpieces.

An example of such an apparatus is shown in FIG. 1 wherein a vertically oriented vessel 10 has at least one bottom drainage/fill means 20 and another more centrally located drainage/fill means 30. Most preferably, drainage/fill means 30 is located above bottom drainage/fill means 20. A workpiece 40 having foreign material 45 is passed through the fluid interface into the bottom portion of vessel 10, in this case into the chloroform layer or HDL 50. The water layer or LDL 60 has a higher affinity for the water and water soluble impurities such that foreign material 45 remains in the water layer. Workpiece 40 may be placed on a mechanical or lever means 70 in order to position, raise and lower workpiece 40 within vessel 10. The water layer or LDL 60 may be removed through drainage/fill means 30 prior to removing workpiece 40. Alternatively, chamber 10 may have a point of entrance in the portion of vessel 10 containing the water layer and a point of exit in the portion of vessel 10 containing the HDL.

Yet another preferred embodiment of the present invention utilizes a particle dissolving HDL, e.g., chloroform or acetic acid, and a LDL, e.g., water or oil, wherein the two fluids are agitated or heated into solution within a tank having workpieces to be cleaned or surface treated. After an effective period of time the agitation ceases causing the particle dissolving HDL with dissolved or suspended particles to fall to the bottom of the tank and the LDL to rise. The thermodynamic state of the system could be changed to promote density and solubility differences of the two fluids. Workpieces would then be passed through the fluid interfaces as a final treatment.

In practicing the preferred embodiments of the present invention, the apparatus of FIG. 1 may also be used with an etching system utilizing the fluid interface methodology disclosed above. Workpiece 40 is first soaked in the bottom portion of vessel 10 wherein HDL 50 is capable of etching a layer from a surface of workpiece 40. A LDL 60 floating above HDL 50 is preferably a fluid which has a low affinity for the layer to be removed such that upon raising workpiece 40 above the fluid interface, the process of etching the workpiece stops almost immediately. Upon soaking workpiece 40 for an effective period of time to remove the unwanted layer, workpiece 40 is passed through the fluid interface into LDL 60 which preferably terminates any reaction process and in some instances may act as a rapid etch stop.

Alternatively, a horizontally oriented vessel utilizing an ether/water system could be used as well for drying applications. Once one batch of workpieces in a first tank has been soaked in the ether for a predetermined amount of time a valve is opened between the first tank and an adjacent second empty tank having wet wafers therein. The ether from the first tank is pumped to the second tank. The valve is then closed, dry wafers from the first tank removed, new wet wafers positioned in the first tank and the first tank sealed to await ether fill from the second tank.

Figure 2:
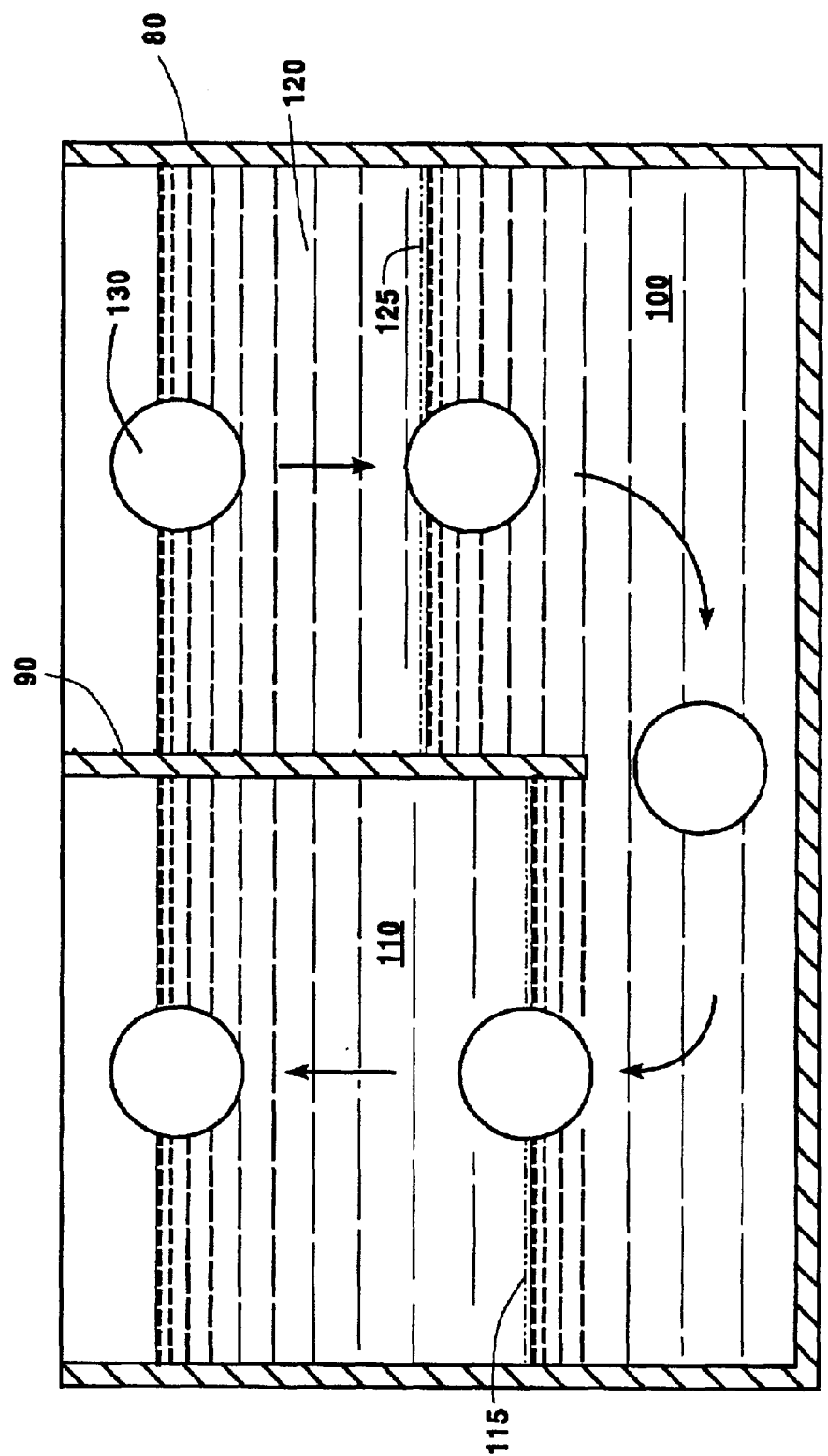
FIG. 2 is a cross-sectional view of a preferred apparatus of the present invention used in practicing another preferred embodiment of the present invention.
Figure 3:
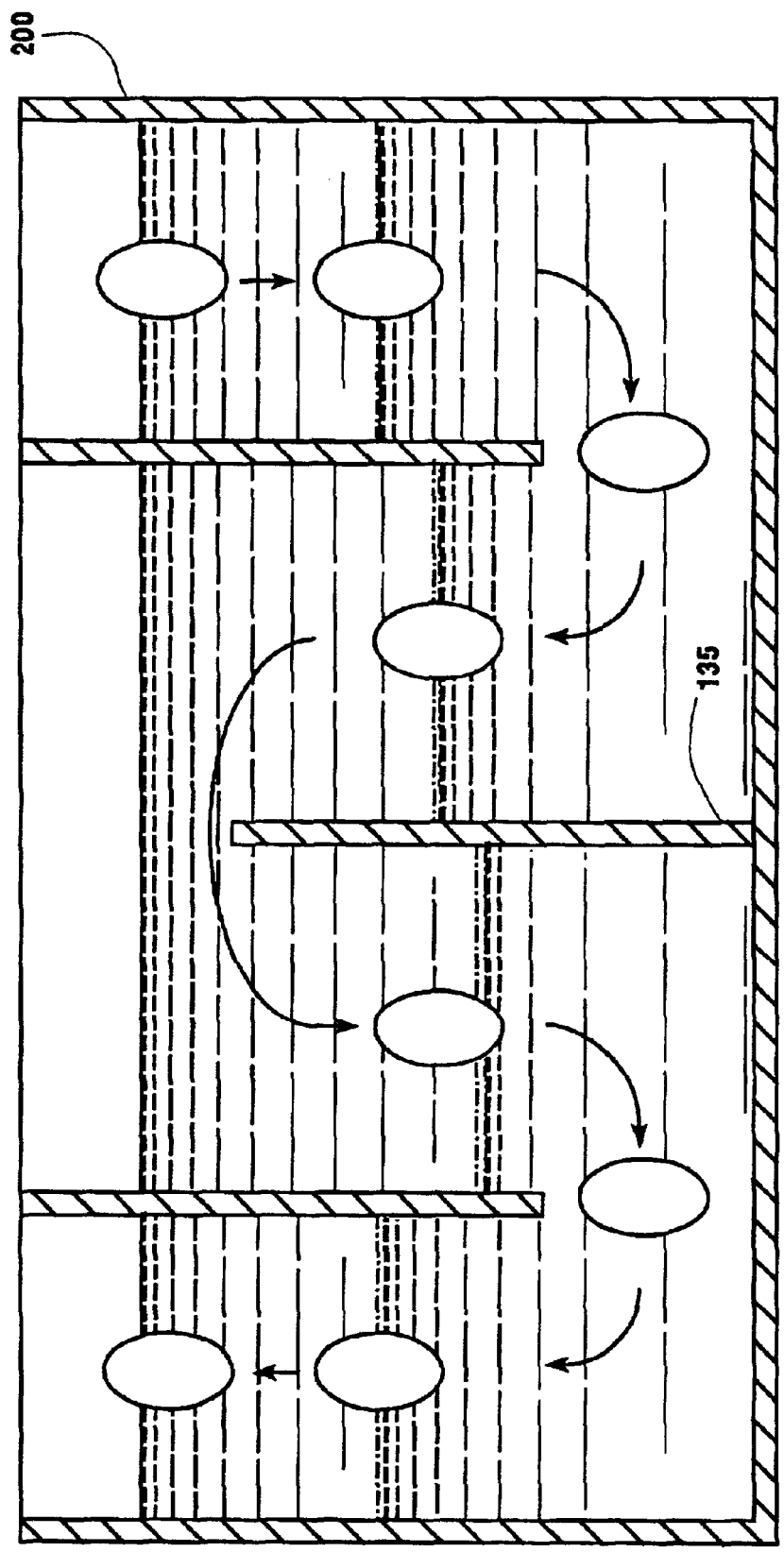
FIG. 3 is a cross-sectional view of a preferred apparatus of the present invention used in practicing yet another preferred embodiment of the present invention.

It is important to note that multiple fluids may be used in practicing the instant invention, thus still yet another preferred apparatus of the present invention is vessel 80 having multiple chambers wherein multiple fluid systems may be used, is illustrated in FIG. 2. Vessel 80 has one or more interior partitions 90 (although only one is shown herein) which extend across a top portion of vessel 80 without completely extending to a bottom of vessel 80 such that multiple fluids may be used in a single system. In FIG. 2, a fluid 100 has a higher density than fluids 110 and 120. Fluids 110 and 120 may or may not have similar densities so long as they have a lower density than fluid 100. Thus, a fluid interface 115 exists between fluid 100 and fluid 110, and a fluid interface 125 exists between fluid 100 and fluid 120. A wafer 130 may enter into vessel 80 through fluid 120, pass through fluid interface 125 into fluid 100, pass through fluid interface 115 and into fluid 110. If additional fluids are needed in the system, a vessel 200 shown in FIG. 3 having one or more interior partitions 135 extending from a bottom surface of vessel 200 may be used in practicing the present invention. The number of interior partitions in the vessel needed to provide a working multi-fluid system can be determined by one of skill in the art.

The present invention achieves the objects recited above. By utilizing two or more fluids of low miscibility and differing densities as a workpiece surface preparation system, fluids may be chosen having an affinity for a material to be removed from a surface of the workpiece. As the workpiece is passed through the fluid interface, residual chemicals including water are substantially removed or processes such as etching are abruptly halted. The apparatus of the present invention allows multiple fluid systems to perform various processes on a surface of a wafer or workpiece wherein the wet chemicals are contained for ease of reuse and recycling.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of etching a layer from a surface of a wafer comprising the steps of:
   providing an etchant fluid;
   providing at least one fluid immiscible with the etchant fluid having a different density than the etchant fluid and forming a fluid interface therebetween;
   positioning a wafer in the etchant fluid to facilitate etching of a layer on the wafer; and
   terminating etching of the wafer when the wafer is passed through the fluid interface into the at least one fluid immiscible with the etchant fluid.

2. The method of claim 1 wherein the step of providing at least one fluid immiscible with the etchant fluid comprises providing two fluids immiscible with the etchant fluid, both fluids having a lower density than the etchant fluid and immiscible with each other such that a first fluid interface exists between the two fluids and the etchant fluid and a second fluid interface exists between the two fluids.

3. The method of claim 2 wherein the step of terminating etching of the surface layer comprises passing the wafer through the first fluid interface into one of the two fluids.

4. The method of claim 2 wherein the step of terminating etching of the surface layer comprises drawing the wafer through the first fluid interface to provide a rapid etch stop and further including the step of passing the wafer through the second fluid interface such that a protective coating is formed on a surface of the wafer.

* * * * *